(12) United States Patent
Mahalingam et al.

(10) Patent No.: US 6,872,655 B2
(45) Date of Patent: Mar. 29, 2005

(54) METHOD OF FORMING AN INTEGRATED CIRCUIT THIN FILM RESISTOR

(75) Inventors: Pushpa Mahalingam, Richardson, TX (US); Robert Hung Nguyen, Richardson, TX (US); Philipp Steinmann, Richardson, TX (US); Eric W. Beach, Tucson, AZ (US); Siang Ping Kwok, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/358,059

(22) Filed: Feb. 4, 2003

(65) Prior Publication Data

US 2004/0152299 A1 Aug. 5, 2004

(51) Int. Cl.[7] .......................................... H01L 21/4763
(52) U.S. Cl. ...................... 438/637; 438/706; 438/689
(58) Field of Search ................................... 438/384, 381

(56) References Cited

U.S. PATENT DOCUMENTS 6,225,183 B1 * 5/2001 Lee .............................. 438/384
6,426,268 B1 * 7/2002 Huppert et al. ............. 438/384

OTHER PUBLICATIONS

S.Wolf & R.N. Tauber, Silicon Processing, vol. 1, Lattice Press, Caf. pp. 532–533.*

* cited by examiner

*Primary Examiner*—David Nelms
*Assistant Examiner*—Thao P. Le
(74) *Attorney, Agent, or Firm*—Peter K. McLarty; W. James Brady, III; Frederick J. Telecky, Jr.

(57) ABSTRACT

A thin film resistor structure (75) is formed on a dielectric layer (60). A capping layer (90) is formed above said thin film resistor structure (75) and vias (110) are formed in the capping layer (90) using a two step etching process comprising of a dry etch process and a wet etch process. Conductive layers (120) are formed in the vias and form electrical contacts to the thin film resistor structure (75).

13 Claims, 2 Drawing Sheets

METHOD OF FORMING AN INTEGRATED CIRCUIT THIN FILM RESISTOR

FIELD OF THE INVENTION

The invention is generally related to the field of thin film resistors and more specifically to a method of forming a thin film resistor with uniform sheet resistance and low contact resistance.

BACKGROUND OF THE INVENTION

Thin film resistors are very attractive components for high precision analog and mixed signal applications. In addition to a low thermal coefficient of resistance, low voltage coefficient of resistance, and good resistor matching they should provide good stability under stress. Precise resistance control of the thin film resistor is essential for high precision analog circuits such as analog-to-digital converters and digital-to-analog converters. In many instances the resistance is adjusted after resistor fabrication by laser trimming. For ease of laser trimming, the thickness of the thin film resistor is made as thin as possible consistent with the requirement of the sheet resistance need for the particular circuit design. For example for silicon chromium (SiCr) thin film resistors having a sheet resistance of 1000 Ohms/square a film thickness of about 3.4 nm is required. To achieve precise sheet resistance values and reduction of circuit area it is critical to minimize the contact area between the thin film resistor head and the thin film resistor layer. In addition during the formation of the vias used to contact the thin film resistor it is imperative to minimize the loss of the thin film resistor material beneath the via. The dry etch methods current in use to form the thin film resistor vias often results in material loss and damage to the thin film resistor. This results in failed resistor contact and/or high contact resistance. A method is therefore needed to form thin film resistors without damaging the resistor during contact formation. The instant invention provides such a method.

SUMMARY OF THE INVENTION

The instant invention describes a method for forming thin film resistor structures on integrated circuits. A thin film resistor structure is formed on a dielectric layer formed over a semiconductor. A capping layer is formed over the thin film resistor structure and vias are formed in the capping layer by performing a dry etch process followed by a wet etch process. Conductive material is then used to fill the vias to form electrical contacts to the thin film resistor structure. A dielectric layer is formed over the capping layer and conductive material followed by the formation of openings in the dielectric layer over the conductive material. Plugs are then formed in the openings such that the plugs contact the conductive material using to fill the vias.

Figure 1:
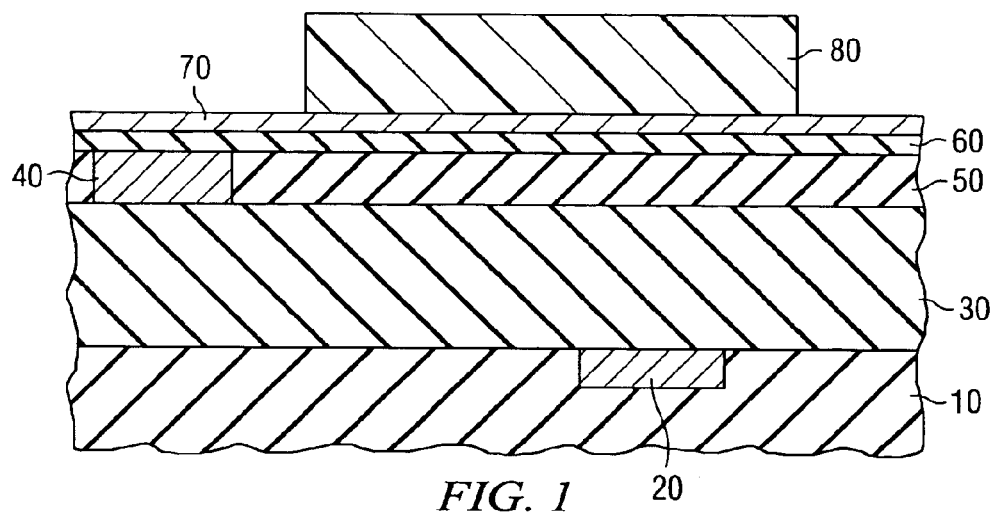
FIG. 1 to FIG. 4 are cross-section drawings illustrating an embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–4, the instant invention can be utilized in many semiconductor device structures. The methodology of the instant invention provides a solution to forming thin film resistors having a uniform sheet resistance and a low contact resistance.

An embodiment of the instant invention is shown in FIGS. 1–4. As shown in FIG. 1 a first inter-level dielectric layer 10 is formed over an integrated circuit. The integrated circuit comprises any number of active devices including MOS and/or bipolar transistors as well as any number of metal interconnect levels. The integrated circuit and any metal interconnect levels are not shown for clarity. The first inter-level dielectric layer 10 can comprise silicon oxide formed using any suitable method including chemical vapor deposition. In a first embodiment the first inter-level dielectric layer 10 is formed using material selected from the group comprising TEOS silicon oxides, PECVD silicon oxides, silicon nitrides, silicon oxynitrides, silicon carbides, spin-on glass (SOG) such as silsesquioxanes and siloxane, xerogels or any other suitable material. Using standard integrated circuit manufacturing technology a first metal layer 20 can be formed in the first inter-level dielectric layer 10. Following the formation of the first inter-level dielectric layer 10 and metal layer 20, a second inter-level dielectric layer 30 can be formed over the first inter-level dielectric layer 10. The second inter-level dielectric layer 30 can be formed using any suitable dielectric material and in a first embodiment is formed using TEOS silicon oxides, PECVD silicon oxides, silicon nitrides, silicon oxynitrides, silicon carbides, spin-on glass (SOG) such as silsesquioxanes and siloxane, xerogels or any other suitable material. Following the formation of the second inter-level dielectric layer 30 an optional high-density plasma (HDP) silicon oxide layer 50 can be formed on the second inter-level dielectric layer 30. A second metal layer 40 can then be formed in the HDP silicon oxide layer if required. An oxide liner layer 60 is then formed over the second inter-level dielectric layer 30 and the optional HDP silicon oxide layer 50 and second metal layer 40 if present. In an embodiment the oxide liner layer is a 300 A to 800 A thick TEOS silicon oxide layer. A resistor layer 70 is then formed over the oxide liner layer 60. In subsequent processing the resistor layer 70 will be etched to form the thin film resistor (TFR). In an embodiment of the instant invention the resistor layer is formed using a silicon chromium (SiCr) alloy, nickel chromium (NiCr) alloy, tantalum nitride, titanium nitride, tungsten, or any other suitable material. A photoresist layer 80 is formed and patterned over the resistor layer 70 and will be used to define the TFR during the etching process.

Figure 2:
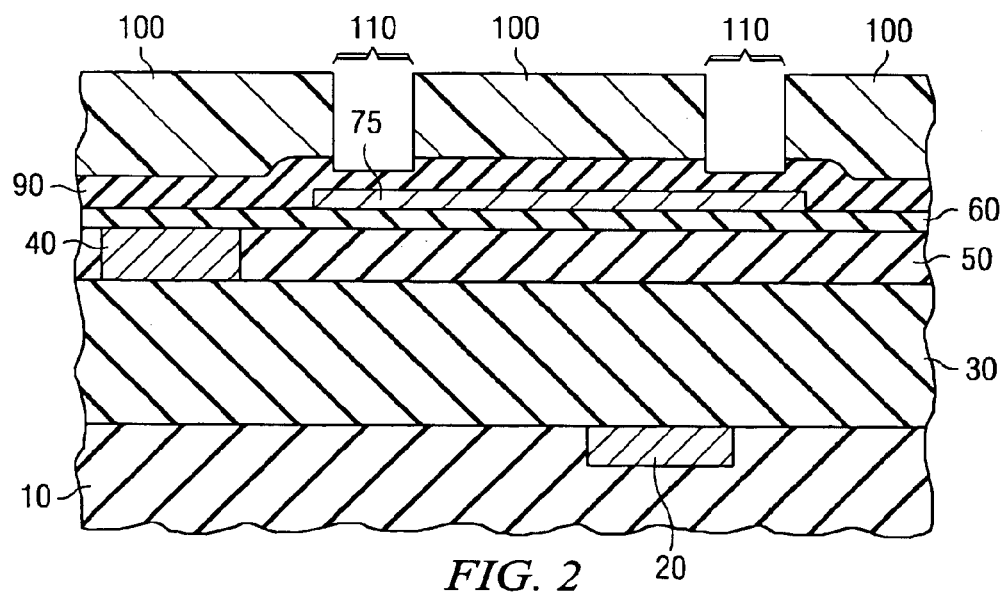

Shown in FIG. 2 is the TFR 75 formed by etching the resistor layer 70 using the photoresist layer 80 shown in FIG. 1 as a masking layer. The resistor layer can be etched using any suitable dry or wet etching process. Following the formation of the TFR structure a capping layer 90 is formed over the TFR structure 75 and any underlying layers. In an embodiment the capping layer is between 600 A and 1500 A and is formed using silicon oxide, silicon nitride, or any other suitable dielectric material. In further embodiments of the instant invention the capping layer can comprise multiple layers formed using layers comprised of the same or differing dielectric material. Following the formation of the capping layer 90 a patterned photoresist layer 100 is formed over the capping layer as shown in FIG. 2 and will be used to pattern the vias that will be subsequently etched through the capping layer 90. Electrical contacts to the TFR will be formed through the vias. Following the formation of the patterned photoresist layer 100 the vias are formed using a multi-step process.

In the first step a dry etching process is used to partially etch the capping layer 90. In an embodiment where the capping layer 90 is formed using silicon oxide, a dry etch can be performed in suitable apparatus such as the TEL-DRM etcher. The etch process is a timed etch designed to stop within 100 A to 300 A of the surface TFR. Therefore if a 1000 A thick capping layer 90 is used the dry etch process will remove 700 A to 900 A of the capping layer. This is shown in FIG. 2 where a portion of the capping layer 90 that is exposed in the via openings 110 is removed using a dry etch process. In a further embodiment the dry etch chemistry can comprise 1–5 sccm of $O_2$, 120–300 sccm of Ar, and 3–13 sccm of $C_4F_8$ at pressures between 50 mT to 140 mT.

Following the partial etching of the vias using a dry etching process, a wet chemical etch will be used to complete the etching of the vias. In a first embodiment the wet chemical etching will be performed following the removal of the patterned photoresist layer 100. In a second embodiment the wet chemical etching will be performed prior to the removal of the patterned photoresist 100. In the first embodiment where the wet chemical etch is performed subsequent to the removal of the patterned photoresist layer, the patterned photoresist layer 100 can be removed using a standard process such as an ash. Following the removal of the patterned photoresist layer, a highly selective wet chemical process is used to complete the etching of the vias. In an embodiment where the capping layer is formed using silicon oxide and the TFR is formed using SiCr, a buffered hydrofluoric (HF) acid etch can be used to etch the vias. The etch rate of a silicon oxide capping layer in a buffered HF etch is approximately 175 A/min compared to an approximately 0.1 A/min etch rate for SiCr. Therefore using the above described wet etch process a minimal amount of the SiCr exposed beneath the via will be removed during the via etching process. This will result in a uniform TFR sheet resistance. In addition there will be no residue formed in the via on the exposed surface of the TFR during the etching process. Residue formed on the surface of the TFR during the etching process will increase the contact resistance of the electrical contacts formed in the vias to contact the TFR. In the second embodiment the wet via etching process is performed prior to the removal of the patterned photoresist layer. In this embodiment a buffered hydrofluoric (HF) acid process can be used to etch the via. Following the etching of the vias the remaining patterned photoresist layer 100 can be removed using standard processes such as an ash.

Figure 3:
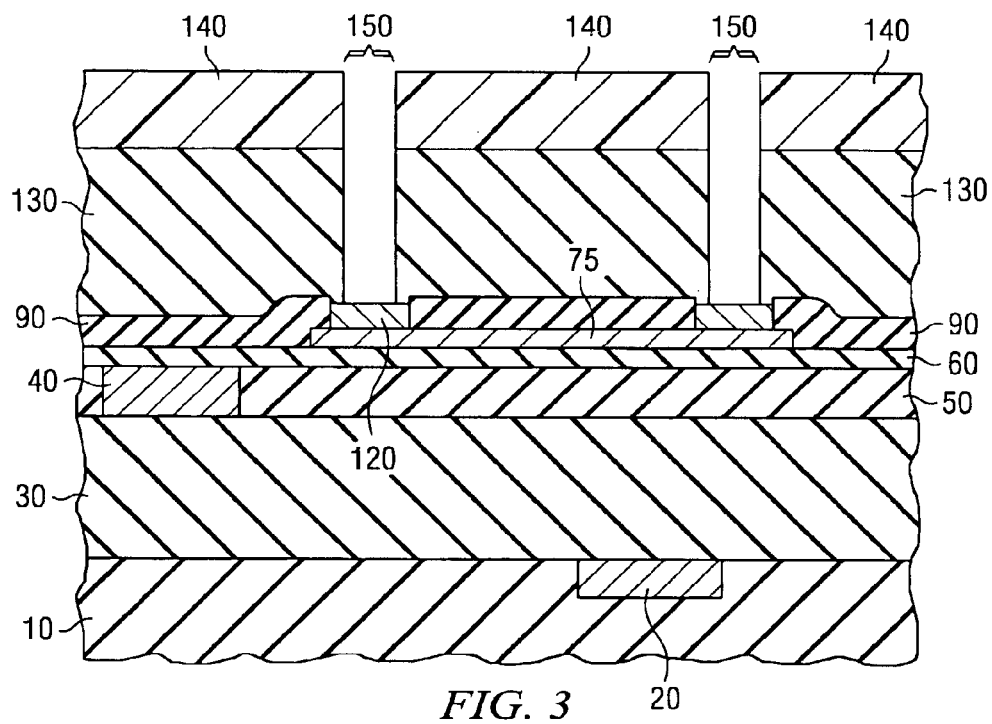

Following the formation of the vias, conductive layers 120 are formed in the via openings as shown in FIG. 3. In an embodiment of the instant invention the conductive layers 120 comprise titanium nitride or a titanium tungsten alloy and are formed by first depositing a blanket layer of the conductive material followed by a patterned etch process. A third inter-level dielectric layer 130 is formed over the structure as shown in FIG. 3 followed by the formation of a patterned photoresist layer 140 on the third inter-level dielectric layer 130. Using the patterned photoresist layer 140 as a mask, openings 150 are formed in the third inter-level dielectric layer 130 which will be used to form electrical contacts to the conductive layers 120. In an embodiment the third inter-level dielectric layer is formed using TEOS silicon oxides, PECVD silicon oxides, silicon nitrides, silicon oxynitrides, silicon carbides, spin-on glass (SOG) such as silsesquioxanes and siloxane, xerogels or any other suitable material.

Figure 4:
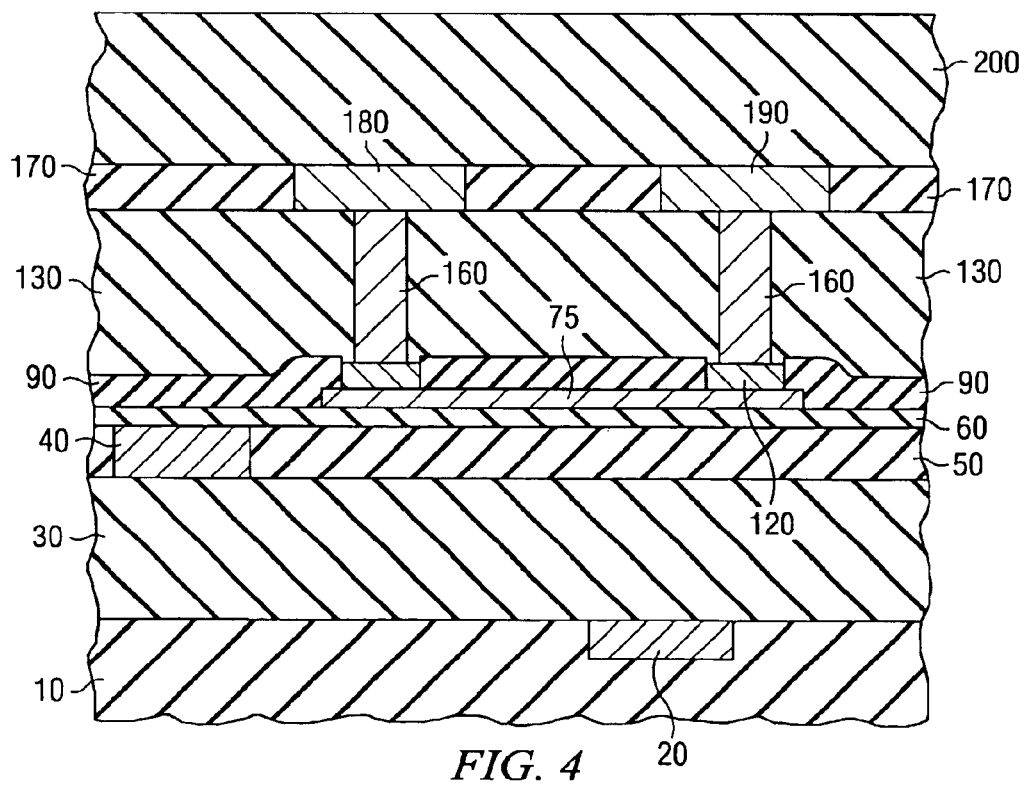

Shown in FIG. 4 is the completed TFR structure. Following the removal of the patterned photoresist layer 140 in FIG. 3, a conductive material is used to fill the openings 150 and form the plugs 160 that will provide electrical contact to the conductive layers 120. In an embodiment of the instant invention this conductive material comprises tungsten, aluminum, titanium, titanium nitride, tantalum nitride, copper, or any suitable conductive material. Following the formation of the conductive plugs 160, a dielectric layer 170 is formed over the third inter-level dielectric layer 130. In an embodiment the dielectric layer can comprise HDP silicon oxide. Metal layers 180 and 190 can be formed in the HDP silicon oxide layer 170 to provide electrical contact to the conductive plugs 160. Metal layers 180 and 190 are used to interconnect the TFR with the other electronic devices that comprise the integrated circuit. Following the formation of the metal layers 180 and 190 addition inter-level dielectric layers 200 can be formed as shown in FIG. 4.

We claim:

1. A method for forming a thin film resistor, comprising:

forming a thin film resistor structure on a first dielectric layer;

forming a capping layer over said thin film resistor structure;

partially etching vias in said capping layer over said thin film resistor structure using a dry etching process comprising 1 sccm to 5 sccm of $O_2$, 120 sccm to 300 sccm of Ar, and 3 sccm to 13 sccm of $C_4F_8$;

complete etching of said vias in said capping layer over said thin film resistor structure using a wet etching process; and forming conductive layers in said vias that contact said thin film resistor structure.

2. A method for forming a thin film resistor, comprising:

forming a thin film resistor structure on a first dielectric layer;

forming a capping layer over said thin film resistor structure;

partially etching vias in said capping layer over said thin film resistor structure using a dry etching process comprising 1 sccm to 5 sccm of $O_2$, 120 sccm to 300 sccm of Ar, and 3 sccm to 13 sccm of $C_4F_8$;

complete etching of said vias in said capping layer over said thin film resistor structure using a wet etching process comprising buffered hydrofluoric acid; and forming conductive layers in said vias that contact said thin film resistor structure.

3. The method of claim 1 further comprising:

forming a second dielectric layer over said capping layer, said conductive layers, and said thin film resistor structure;

forming openings in said second dielectric layer above said conductive layers; and forming plugs in said openings that contact said conductive layers.

4. The method of claim 3 wherein said plugs are formed with a material from the group consisting of tungsten, aluminum, titanium, titanium nitride, tantalum nitride, and copper.

5. A method for forming an integrated circuit thin film resistor, comprising:

forming a thin film resistor structure on a first dielectric layer;

forming a capping layer over said thin film resistor structure;

partially etching vias in said capping layer over said thin film resistor structure using a dry etching process comprising 1 sccm to 5 sccm of $O_2$, 120 sccm to 300 sccm of Ar, and 3 sccm to 13 sccm of $C_4F_8$;

complete etching of said vias in said capping layer over said thin film resistor structure using a wet etching process comprising buffered hydrofluoric acid; and forming conductive layers in said vias that contact said thin film resistor structure.

6. The method of claim 5 wherein said thin film resistor structure is formed from a material consisting of silicon chromium (SiCr) alloy, nickel chromium (NiCr) alloy, tantalum nitride, titanium nitride, and tungsten.

7. The method of claim 6 wherein said capping layer is formed from a material consisting of silicon oxide and silicon nitride.

8. The method of claim 7 further comprising:

forming a second dielectric layer over said capping layer, said conductive layers, and said thin film resistor structure;

forming openings in said second dielectric layer above said conductive layers; and forming plugs in said openings that contact said conductive layers.

9. The method of claim 8 wherein said plugs are formed with a material from the group consisting of tungsten, aluminum, titanium, titanium nitride, tantalum nitride, and copper.

10. A method for forming an integrated circuit thin film resistor, comprising:

forming a thin film resistor structure on a first dielectric layer;

forming a capping layer over said thin film resistor structure;

partially etching vias in said capping layer over said thin film resistor structure using a dry etching process comprising 1 sccm to 5 sccm of $O_2$, 120 sccm to 300 sccm of Ar, and 3 sccm to 13 sccm of $C_4F_8$;

complete etching of said vias in said capping layer over said thin film resistor structure using a wet etching process comprising buffered hydrofluoric acid;

forming conductive layers in said vias that contact said thin film resistor structure;

forming a second dielectric layer over said capping layer, said conductive layers, and said thin film resistor structure;

forming openings in said second dielectric layer above said conductive layers; and forming plugs in said openings that contact said conductive layers.

11. The method of claim 10 wherein said thin film resistor structure is formed from a material consisting of silicon chromium (SiCr) alloy, nickel chromium (NiCr) alloy, tantalum nitride, titanium nitride, and tungsten.

12. The method of claim 11 wherein said capping layer is formed from a material consisting of silicon oxide and silicon nitride.

13. The method of claim 12 wherein said plugs are formed with a material from the group consisting of tungsten, aluminum, titanium, titanium nitride, tantalum nitride, and copper.

* * * * *